United States Patent [19]
Inoue et al.

[11] Patent Number: 5,328,514
[45] Date of Patent: Jul. 12, 1994

[54] DEVICE FOR FORMING FILM BY PHOTO-CHEMICAL VAPOR DEPOSITION

[75] Inventors: Naoki Inoue, Higashiosaka; Haruyuki Nakaoka, Kishiwada; Hideki Azuma, Nishinomiya; Shigeru Morikawa, Yokohama; Takashi Kobayashi, Kawanishi, all of Japan

[73] Assignee: Osaka Gas Company Limited, Japan

[21] Appl. No.: 809,915

[22] Filed: Dec. 19, 1991

[30] Foreign Application Priority Data

Dec. 21, 1990 [JP] Japan .................... 2-418142

[51] Int. Cl.⁵ .................................. C23C 16/48
[52] U.S. Cl. .................................. 118/722; 118/715
[58] Field of Search ............... 118/722, 719, 715; 427/53.1, 54.1, 582, 583, 584

[56] References Cited

U.S. PATENT DOCUMENTS

| | | | |
|---|---|---|---|
| 4,495,218 | 1/1985 | Azuma et al. | 427/53.1 |
| 4,568,565 | 2/1986 | Gupta et al. | 427/53.1 |
| 5,100,832 | 3/1992 | Khagawa et al. | 437/107 X |

FOREIGN PATENT DOCUMENTS 61-1213375  9/1986  Japan .
61-1217575  9/1986  Japan ........................ 118/723

OTHER PUBLICATIONS

G. A. West et al., "Laser Induced Chemical Vapor Deposition of Titanium Silicide Films", Nov. 1985.
P. K. Beyer et al., "Laser Induced Chemical Vapor Deposition of SiO₂", Apr. 1985.

*Primary Examiner*—Tom Thomas
*Assistant Examiner*—Jonathan D. Baskin
*Attorney, Agent, or Firm*—Larson and Taylor

[57] ABSTRACT

The invention provides a film-forming apparatus by a photo-CVD method comprising such essential structural elements as a light inlet in the form of a tube, a film-forming chamber, a light outlet in the form of a tube and a nozzle for feeding a mixture of a reactant and a gas for dilution so that a specific relation exists in the dimensions between the elements.

With this structure, the film-forming apparatus by a photo-CVD method prevents the blur of the laser beam-incoming window due to contaminants adhered thereto, thereby enabling the extension of reaction time, increase of the deposition, and formation of a film with uniform thickness, and making the composition of the film closest to the stoichiometric one.

4 Claims, 3 Drawing Sheets

DEVICE FOR FORMING FILM BY PHOTO-CHEMICAL VAPOR DEPOSITION

FIELD OF THE INVENTION

This invention relates to an apparatus for forming a thin or thick film according to a photo-chemical vapor deposition method (the apparatus will be hereinafter referred to simply as "a film-forming apparatus" unless especially required).

PRIOR ART AND PROBLEMS THEREOF

Conventional film-forming apparatus by photo-chemical vapor deposition methods have the following problems.

(a) A light-incoming window at a light inlet is likely to become blurred due to the reaction gas adhered thereto, hindering laser beams from passing therethrough which leads to a decrease of operational efficiency. To prevent the blur of the light-incoming window, it is necessary to avoid the deposition of reaction gas on the window by spraying an inactive gas to the window through a nozzle or separating the light inlet from the film-forming chamber.

(b) These apparatus provide films with a uniform thickness but produce films at a lower deposition rate than conventional apparatus by other chemical vapor deposition methods (CVD), such as thermal CVD, plasma CVD or the like. Substantially no improvement has been achieved so far in this respect.

(c) It is difficult to form a film of stable silicon compound having a stoichiometric ratio irrespective of the film thickness because of impurities contained therein. In this case, the resultant film is likely to change in quality with time, and thus lacks reliability.

(d) In the method wherein laser beams are applied in parallel with the surface of substrate, the thickness of film on the substrate widely varies depending on measurement on light-incoming side or on light-outgoing sides. In other words, it has been difficult to obtain a film of uniform thickness.

MEANS FOR RESOLVING THE PROBLEMS

The present inventors conducted research in view of the foregoing prior art problems and found that the problems can be pronouncedly mitigated or substantially eliminated when a film-forming apparatus by a photo-CVD method comprises such essential structural elements as a light inlet in the form of a tube, a film-forming chamber, a light outlet in the form of a tube and a nozzle for feeding a mixture of a reactant and a gas for dilution so that a specific relation exists in the dimensional proportions between the elements substantially irrespective of their critical dimensions.

The present invention provides film-forming apparatus by photo-chemical vapor deposition methods as described below.

1. A film-forming apparatus by a photo-chemical vapor deposition method which is of the integral type and which is adapted to photo-chemically activate a mixture of reactant and gas for dilution to form a film on the substrate surface, the apparatus being characterized in that:

(1) the length $l_1$ of a tubular light inlet, the length $l_2$ of a film-forming chamber and the length $l_3$ of a tubular light outlet are in the ratio of 2-6:10:2-6, (2) means is provided for spraying an inactive gas other than the reactant directly to the light-permeable materials constituting the light-incoming window at the light inlet and the light-outgoing window at the light outlet, and (3) the diameter (d) of a substrate holder in the film-forming chamber and the distance (h) between the substrate holder and a nozzle for feeding the mixture of a reactant and a gas for dilution into the film-forming chamber are in the ratio of 1:1-2.

2. A film-forming apparatus by a photo-chemical vapor deposition method as set forth in item 1, wherein the substrate holder is made of stainless steel, molybdenum, Inconel or Hastelloy and has embedded therein a sheathed heater for heating the substrate holder to a predetermined temperature, and the substrate holder is adjustable to an angle of 0° to 10° relative to incident light, or incident light can be applied at an angle of 0° to 10° relative to the substrate holder horizontally fixed.

3. A film-forming apparatus by a photo-chemical vapor deposition method as set forth in item 1 or 2, wherein the incident light is a laser beam of 190 to 230 nm wavelength or is an electromagnetic beam capable of producing an effect similar to that of said laser beam, any of said beams having a single wavelength or two mixed wavelengths produced by a monochromator.

4. A film-forming apparatus by a photo-chemical vapor deposition method as set forth in any of items 1 to 3, wherein the light-permeable materials constituting the light-incoming window at the light inlet and the light-outgoing window at the light outlet are quartz or calcium fluoride and form the windows having a thickness and a diameter in the ratio of 1:12-15.

DETAILED DESCRIPTION OF PREFERRED EMBODIMENTS

The film-forming apparatus of the invention will be described below in more detail according to the embodiments shown in the accompanying drawings.

Figure 1:
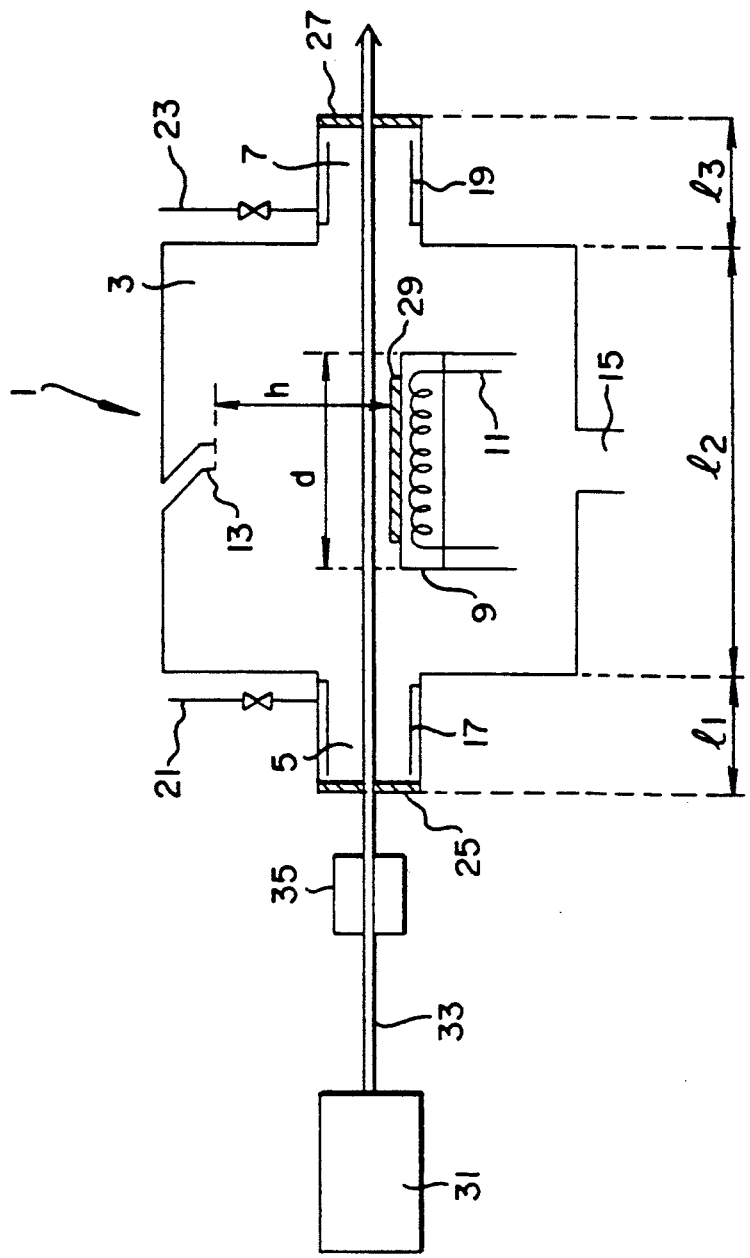
FIG. 1 is a schematic sectional view showing an embodiment of the film-forming apparatus according to the invention.

The film-forming apparatus 1 shown in FIG. 1 comprises a film-forming chamber 3, a tubular light inlet 5 and a tubular light outlet 7 each connected to the film-forming chamber 3, a substrate holder 9 holding a substrate 29 and having embedded therein a sheathed heater 11, a nozzle 13 for feeding a mixture of a reactant and a gas for dilution into the film-forming chamber 3, and an exhaust port 15 for discharging the gas after reaction.

In the illustrated film-forming apparatus of the invention, the tubular light inlet 5 and the tubular light outlet 7 have a double tubing structure so that in operation of the apparatus, an inactive gas, such as nitrogen, argon, helium or the like, is slowly and uniformly supplied through lines 21 and 23 and gaps 17 and 19 to a light (laser beam)-incoming window 25 and a light (laser beam)-outgoing window 27. Thus the reactant and the reaction product do not remain at and by the light-incoming window 25 and light-outgoing window 27 with the result that the windows 25 and 27 are effectively prevented from becoming blurred due to the reactant and reaction product adhered thereto. The spacing or gap between the double tubes is preferably 1 to 5 mm. Light beams to be applied include specific light beams which are able to supply energy required for exciting the reactant and dissociating the binding thereof, i.e., a laser beam of 190 to 230 nm wavelength or an electromagnetic beam (ultraviolet light, etc.) capable of producing a similar effect to that of said laser beam, any of said laser beams having a single wavelength or two mixed wavelengths produced by a monochromator.

The film-forming apparatus is operated in the same manner as conventional film-forming apparatus. Laser beam 33 from a source 31 is passed through a lens 35 to deflect into a sheet-like form. The beam is introduced into the film-forming chamber 3 through the light-incoming window 25 to activate a mixture of a reactant and a gas for dilution in the chamber 3, and is brought out of the apparatus 1 through the light-outgoing window 27.

In the film-forming apparatus of the invention, the dimensions of essential structural elements are first set so that the length ($l_1$) of the tubular light inlet 5, the length ($l_2$) of the film-forming chamber 3 and the length ($l_3$) of the tubular light outlet 7 are in the ratio of 2–6:6:10:2–6 as seen in FIG. 1 When the proportions of lengths $l_1$ and $l_3$ are too low with respect to the length $l_2$, the light-incoming window 25 and light-outgoing window 27 are likely to become blurred. When the proportions of lengths $l_1$ and $l_3$ are too high with respect to the length $l_2$, the windows 25 and 27 are not blurred but components of larger size are required, resulting not only in higher costs but in a waste of time involved for producing a vacuum, e.g. for purging due to increased volume of components.

In the film-forming apparatus of the invention, the diameter (d) of the substrate holder 9 and the distance (h) between the nozzle 13 and the holder 9 are essentially in the ratio of 1:1–2. The film-forming apparatus is required to form a film as uniformly as possible. Important for this purpose is linear velocity of the mixture of a reactant and a gas for dilution on the surface of the substrate 29 (i.e., a relationship between the cross-sectional area of the nozzle 13 and the gas flow). It has been confirmed that the film-forming apparatus of the invention forms a film of uniform thickness when d and h are in the ration of 1:1–2.

The substrate holder 9 is preferably made of a heat-resistant material, such as stainless steel, molybdenum steel, Ni-Cr steel (e.g. inconel), Ni-Mo-Cr steel (e.g. hastelloy) and so on which withstand the heat emitted from the sheathed heater 11 so embedded in the holder 9 as to enable the temperature control from outside. Preferred is a structure wherein the substrate holder 9 is adjusted to an angle of 0° to 10° relative to the laser beam 33 (an angle in rightwardly upward direction in FIG. 1), or alternatively incident light is applied at an angle of 0° to 10° relative to the substrate holder 9 fixed horizontally. This structure is preferred because a thicker film is apt to form on the substrate 29 at the left side of FIG. 1 and the substrate is disposed slantingly to facilitate the formation of a film with uniform thickness.

This phenomenon is presumably based on the following principle. When the reactant is brought onto the substrate due to the excitement of reactant by photons in the photo excited chemical reaction, there is a difference in the mean free path of molecules and in the collision energy of molecules and photons between the light-incoming side and the light-outgoing side of the substrate. In view of the difference, when the substrate is inclined with respect to the direction of irradiation, the distance which the excited reactant covers to reach the substrate is varied depending on the location of the substrate with the result that a film is formed on the substrate at an uniform growth rate and is imparted a uniform thickness.

The light-incoming window 25 at the light inlet 5 and the light-outgoing window 27 at the light outlet 7 are preferably made of quartz or calcium fluoride. A preferred ratio of thickness to diameter of the respective windows 25 and 27 is 1:12 to 15. The light-incoming window 25 and the light-outgoing window 27 need to endure the energy of high density produced by irradiation at a high repetition rate with the laser beam. The thickness of the windows is generally about 10 to about 15 mm. It is proper to specify the thickness-diameter ratio of the windows to the above range in order to pass laser beams through the windows of the above thickness without scattering, reflection and absorption.

Other operational conditions for the film-forming apparatus of the invention are the same as for conventional apparatus.

For example, when a $Si_3N_4$ film is formed on the silicon substrate 29, a reaction gas mixture of $SiH_4$, $NH_3$ and $N_2$ for the formation of film is fed into the film-forming apparatus 1 at a pressure maintained at about 3 to 50 Torr, and $N_2$ is sprayed onto the light-incoming window 25 and the light-outgoing window 27 through the gaps 17 and 19. The silicon substrate 29 is maintained at a temperature of e.g. 350° C. by the sheathed heater 11 embedded in the holder 9. Laser beams to be employed are not particularly limited and, for example, can be ArF excimer laser beam which is oscillated at pulse energy of about 40 to about 60 mj and at a repetition rate of about 10 to about 100 Hz.

Alternatively a gas mixture of $Si_2H_6$, $NH_3$ and $N_2$ may be used to form a $Si_3N_4$ film in the same manner as above.

EFFECTS OF THE INVENTION

The present invention can achieve the following remarkable results.

(1) The film-forming apparatus of the invention can effectively prevent the blur of light (laser beam)-incoming window due to the contaminant adhered thereto which has been considered the defect of conventional film-forming apparatus by photo-chemical vapor deposition methods. Consequently the film-forming apparatus of the invention can be continuously operated with stability over a prolonged period of time without reducing the transmittance of laser beams through the window.

(2) The contaminant adhered to the laser beam-incoming window can be readily removed by a solvent, such as alcohol or the like.

(3) The film-forming apparatus of the invention is 50 Torr in the upper limit of total pressure in contrast with 10 Torr which is considered the upper limit of total pressure of conventional film-forming apparatus by photo-chemical vapor deposition methods, and has a partial pressure of reaction gas correspondingly increased.

(4) A gas curtain is produced by spraying a small quantity of inactive gas onto the laser beam-incoming window and laser beam-outgoing window. The curtain precludes diffusion and dilution of gas mixture flowing from the nozzle to the exhaust port, thereby enabling effective use of photon and formation of a film of stoichiometric composition on the substrate.

(5) With these features, the film-forming apparatus of the invention can produce a film at a deposition rate of higher than 0.1 µm/min, namely more than ten times the rate of conventional photo CVD film-forming apparatus.

(6) As to the uniformity of film thickness, the film-forming apparatus of the invention with a simpler construction can produce films on substrates of large area with a thickness better controlled than conventional apparatus (for example, those disclosed in Japanese Unexamined Patent Publications Nos. 27238/1986, 96910/1988 and 103074/1988).

EXAMPLES

The features of the invention will be clarified with reference to the following examples.

EXAMPLE 1

The film-forming apparatus by a photo-chemical vapor deposition method as shown in FIG. 1 was operated, producing a $Si_3N_4$ film of about 800 Å in thickness on a silicon substrate of 5 inches in diameter. The details of the apparatus and operational conditions are as follows.

| | |
|---|---|
| * Volume of film-forming chamber | 27.1 lit. |
| * Diameter of light inlet | 150 mm |
| * Diameter of light outlet | 150 mm |
| * $l_1$ | 146 mm |
| * $l_2$ | 500 mm |
| * $l_3$ | 146 mm |
| * d | 150 mm |
| * h | 110 mm |
| * Angle of silicon substrate (relative to incident laser beam) | 5° |
| * Total pressure in the apparatus | 10 Torr |
| * Composition of gas mixture $SiH_4$ 1 cc/min + $NH_3$ 10 cc/min + $N_2$ 60 cc/min | |
| * Amount of $N_2$ to be sprayed on the light-incoming window and light-outgoing window | 200 cc/min |
| * Heating temperature of silicon substrate | 350° C. |
| * Laser beam AeF excimer laser | |
| Pulse energy | 60 mj |
| Repetition rate | 100 Hz |

Figure 2:
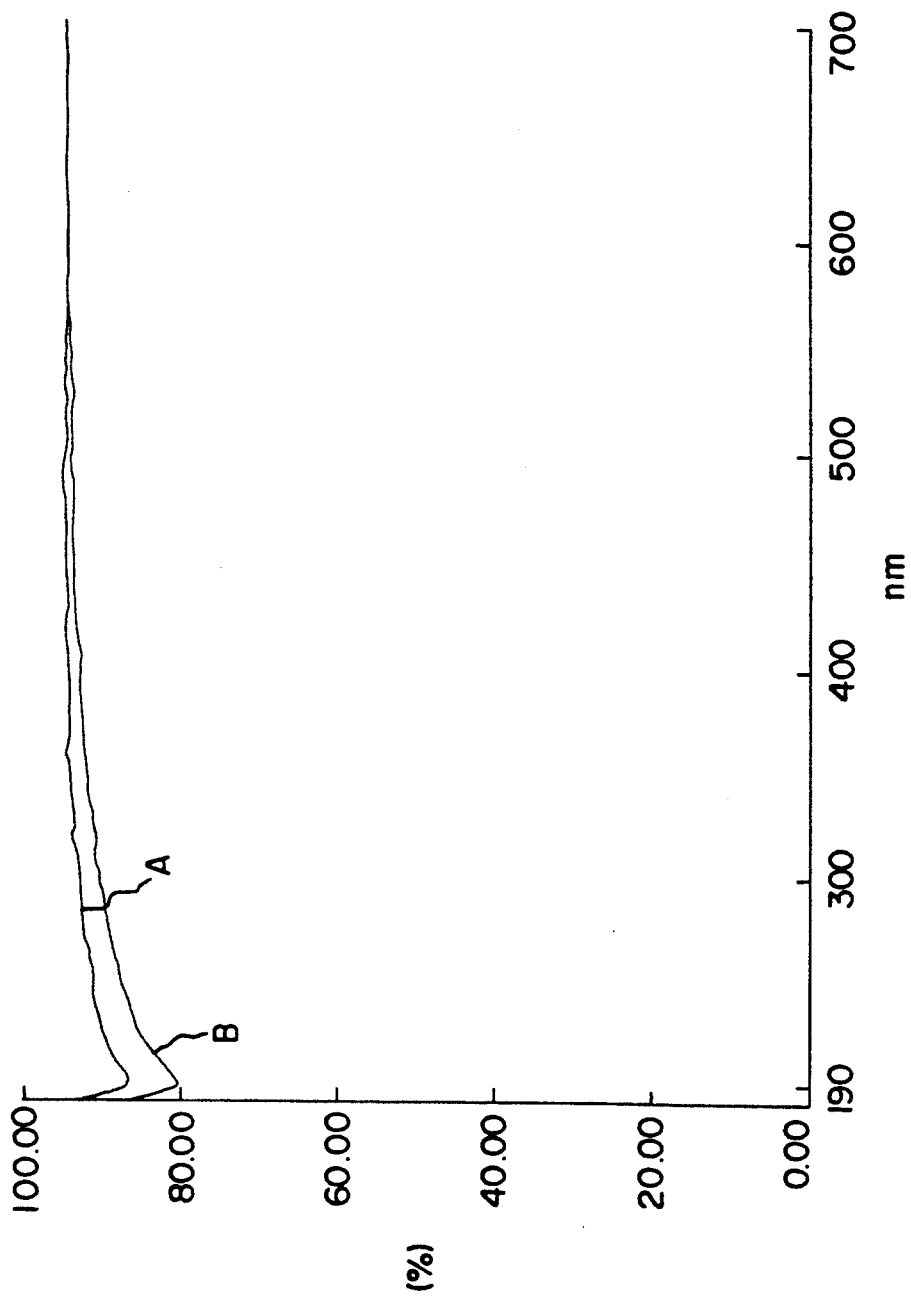
FIG. 2 is a graph showing the variation, with time, in the percent transmittance of ultraviolet beams of 190 to 700 nm through a synthetic quartz plate used as a laser beam-incoming window in the embodiment of the film-forming apparatus according to the invention.

FIG. 2 shows the percent transmittance of ultraviolet beam of 193 to 700 nm through a synthetic quartz plate used as a laser beam-incoming window. A curve A shows the results obtained before operation of the apparatus, and a curve B indicates the measurements obtained after six-month operation (operating time 600 hours).

As seen from FIG. 2, according to the invention, the diminish of transmittance on exposure to laser beam which diminish is the defect of conventional apparatus was greatly alleviated and stood at about 5% at a wavelength of about 193 nm six months after the start of operation. The contaminant on the laser-incoming window which impairs the transmittance was readily removed by a solvent, such as alcohol or the like. After removal of contaminant, the transmittance at the laser-incoming window was recovered substantially to the original level. The film-forming apparatus of the invention can markedly mitigate the problem of conventional apparatus that the reaction product is deposited gradually on the laser-incoming window with time, thereby reducing the intensity of laser beam to an extent necessitating the shutdown of operation. In other words, the film-forming apparatus of the invention eliminates the need to remove the contaminant from the light-incoming window taken out from the apparatus, and thus is allowed to continue the photo excited reaction over an extended period of time.

Figure 3:
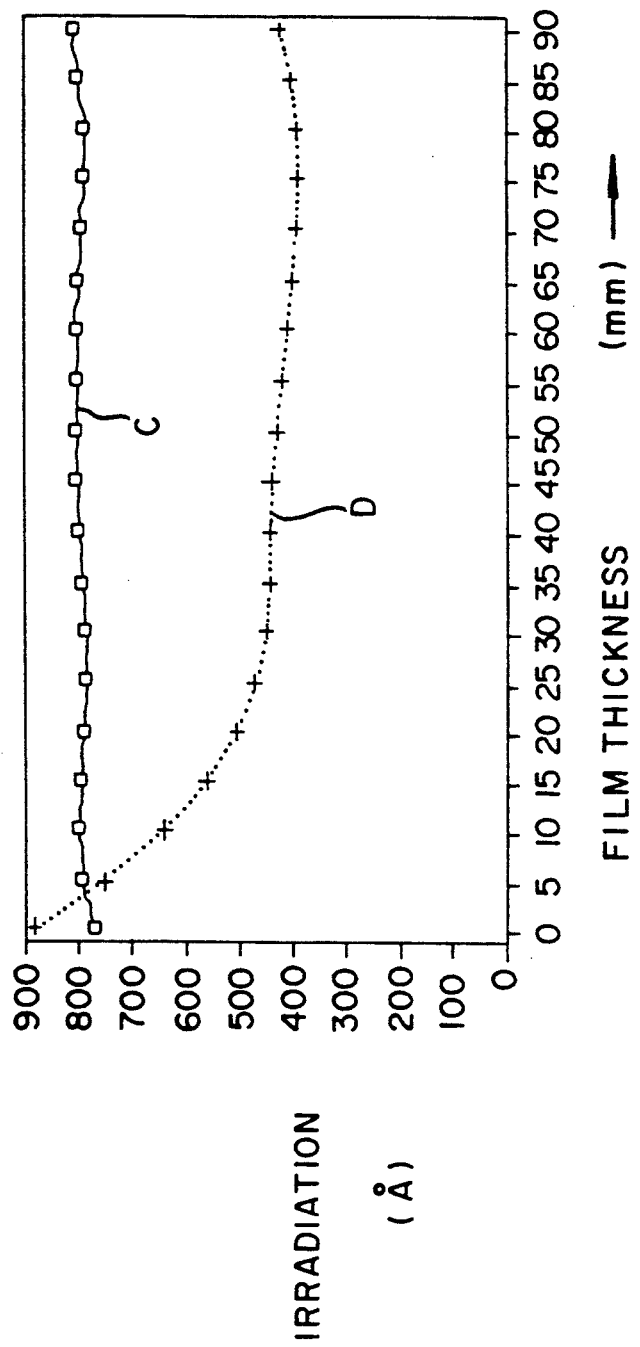
FIG. 3 is a graph showing the distribution of the thickness of a $Si_3N_4$ film formed on a silicon substrate of 5 inches in diameter by the film-forming apparatus of the invention, the distribution being determined in parallel with the direction of laser beam irradiation.

FIG. 3 shows the distribution of film thickness of a $Si_3N_4$ film formed on a silicon substrate of 5 inches in diameter, as determined in parallel with laser beam irradiation. A curve C shows the state of the film formed by the apparatus of the invention operated under the aforesaid conditions, and a curve D indicates the state of the film formed by a conventional film-forming apparatus by a photo-chemical vapor deposition method.

The film-forming apparatus of the invention gave a film of uniform thickness (±2.2% or less deviation), whereas the conventional apparatus by photo CVD method afforded a film having a thickness decreased with an increase of the distance from the laser beam-incoming window.

What we claim is:

1. A film-forming apparatus for performing a photo-chemical vapor deposition method which is adapted to photo-chemically activate a mixture of a reactant and diluent gas to form a film on the substrate surface, the apparatus being characterized in that:

(1) the length $l_1$ of a tubular light inlet, the length $l_2$ of a film-forming chamber and the length $l_3$ of a tubular light outlet are in the ratio of 2-6:10:2-6, (2) means is provided for spraying an inactive gas other than the reactant directly tot he light-permeable materials constituting the light-incoming window at the light inlet and the light-outgoing window at the light outlet, (3) the diameter (d) of a substrate holder in the film-forming chamber and the distance (h) between the substrate holder and a nozzle for feeding the mixture of a reactant and a gas for dilution into the film-forming chamber are in the ratio of 1:1-2

(4) means for providing an incident light beam through said light incoming window and said light outgoing window, said tubular light inlet and the tubular light outlet each having walls forming a concentric double tubing structure with gaps between the walls, said tubular light inlet and said tubular light outlet extending parallel to and concentric with said incident light beam so that the inactive gas is uniformly supplied through the gaps between the walls in the double tubing structure to the light-incoming window and to the light-outgoing window.

2. A film-forming apparatus for performing a photo-chemical vapor deposition method according to claim 1 wherein the substrate holder is made of stainless steel, molybdenum, inconel or hastelloy and has embedded therein a sheathed heater for heating the substrate holder to a predetermined temperature, and the substrate holder is adjustable to an angle of 0° to 10° relative to incident light, or incident light can be applied at an angle of 0° to 10° relative to the substrate holder horizontally fixed.

3. A film-forming apparatus for performing a photo-chemical vapor deposition method according to claim 1 or 2 wherein the incident light is a laser beam of 190 to 230 nm wavelength or is an electromagnetic beam capable to supply energy required for exciting the reactant and dissociating the binding thereof, any of said beams having a single wavelength or two wavelengths mixed by a monochromator.

4. A film-forming apparatus for performing a photo-chemical vapor deposition method according to claim 1 wherein the light-permeable materials constituting the light-incoming window at the light inlet and the light-outgoing window at the light outlet are quartz or calcium fluoride and form the windows having a thickness and a diameter in the ratio of 1:12–15.

* * * * *